United States Patent [19]

McKenney et al.

[11] Patent Number: 5,095,628
[45] Date of Patent: Mar. 17, 1992

[54] PROCESS OF FORMING A RIGID-FLEX CIRCUIT

[75] Inventors: Darryl J. McKenney, Milford; Lee Millette, Hudson; Herb Dixon, Derry; Roland Caron, Hudson, all of N.H.

[73] Assignee: Teledyne Industries, Inc., Los Angeles, Calif.

[21] Appl. No.: 565,437

[22] Filed: Aug. 9, 1990

[51] Int. Cl.$^5$ .............................. H05K 3/02
[52] U.S. Cl. ............................ 29/846; 156/289; 156/313; 439/67
[58] Field of Search ................. 439/67; 156/289, 313; 29/846

[56] References Cited

U.S. PATENT DOCUMENTS

| | | | |
|---|---|---|---|
| 3,393,392 | 7/1968 | Shelley | 439/67 |
| 4,001,466 | 1/1977 | Shaul et al. | 156/289 X |
| 4,191,800 | 3/1980 | Holtzman | 156/313 X |
| 4,808,461 | 1/1989 | Dixon et al. | 29/846 X |
| 4,857,400 | 8/1989 | Kloss, Jr. | 156/289 X |
| 4,931,134 | 6/1990 | Hatkevitz et al. | 29/846 X |

OTHER PUBLICATIONS

IBM Tech. Discl. Bull., vol. 14, No. 3, Aug. 1971, pp. 701-702, by F. P. Ardito et al.

Primary Examiner—Carl J. Arbes
Attorney, Agent, or Firm—Hayes, Soloway, Hennessey & Hage

[57] ABSTRACT

In a process for manufacturing a rigid-flex printed circuit wherein a rigid insulating layer supports one portion of the printed circuit and a flexible insulator supports another portion thereof to furnish flexible leads for connection the printed circuit to an operative device, a first assembly is provided comprising a curable prepreg insulator layer having an opening for the flexible leads. A flexible sheet spans the opening, and the assembly is pressed with one surface in contact with a smooth hard surface while the other surface is supported by a flowable curable prepreg layer. The insulator and flowable layers are a release layer which prevents bonding between the prepreg layers throughout most of the areas while permitting bonding along the edges. The assembly is maintained under heat and pressure to partially cure both prepreg layers and bond the flexible sheet to the edges of the opening and bond the edges of the prepregs together to form a flat rigid sandwich. A sheet of copper is bonded to that surface previously in contact with the hard surface. In a second pressing operation the copper is bonded to both the partially cured prepreg layer and the flexible sheet, and thereafter the bonded edges of the cured prepreg layers, are severed to permit separation of the cured prepreg layers.

5 Claims, 3 Drawing Sheets

PROCESS OF FORMING A RIGID-FLEX CIRCUIT

BACKGROUND OF THE INVENTION

The present invention relates to multi-layer combined rigid and flexible printed circuits having flexible printed circuits extending from a rigid circuit board and more particularly to improvements in and the process described in my earlier U.S. Pat. No. 4,800,461 issued Jan. 24, 1989 and assigned to the assignee of the present invention. In my earlier U.S. Pat. NO. 4,800,461, particularly as described in FIG. 5 thereof, a Rigid-Flex circuit board is shown wherein a fiberglass-epoxy rigid section is provided with an opening spanned by a flexible polyimide which is designed to provide flexible leads extending from the rigid portion of the board.

In producing the basic copper-fiberglass/polyimide laminate, difficulties have been encountered in providing a smooth, ripple-free laminate which can be held accurately in the focal plane of a photo-resist exposure system for providing the precise photo image which is subsequently developed in the overall etching process to produce the fine copper leads.

SUMMARY OF THE INVENTION

The present invention is directed to an improved process for manufacturing, such Rigid-Flex printed circuit boards where a rigid insulating layer supports one portion of the printed circuit and a flexible insulator supports another portion thereof to furnish flexible leads for connecting the printed circuit to an operative device. In the improved process of the present invention, a first assembly is provided comprising a partially cured rigid prepreg (preferably fiberglass-epoxy) having an opening for the flexible leads. A flexible insulating sheet, such as a polyimide spans this opening and overlies the edges by a very small amount, on the order of 0.050 inch. This assembly is placed in contact with a deformable pressure transmitting body such as a flowable, curable "conformal" prepreg to form a sandwich. Preferably another partially cured windowed fiberglass/polyimide assembly is placed on the other side of the flowable conformal layer. Since the "conformal" prepreg is only a process element of the sandwich and is not to be incorporated in the final printed circuit, it is provided with release layers on both of it's surfaces to prevent bonding of the major area of "conformal" to the outer fiberglass prepreg layer. These release layers are preferably smaller in dimension than the conformal and prepreg layers so that the fiberglass epoxy layers extend about an inch beyond each edge of the release layers. In a preferred embodiment of the invention, the sandwich is made of two of the fiberglass-prepreg/polyimide sheets, one on each side of the deformable body. This sandwich is then placed between two hard smooth surfaces, such as steel plates, and pressed to partially cure the fiberglass-prepreg and firmly bond the polyimide sheet to the edges of the opening. In the first pressing operation the edges of the prepreg and "conformal" layers are bonded together, and the conformal layer is made rigid. Release layers are provided between the steel pressing plates and the top and bottom prepreg layers to prevent bonding to the steel plate. These outer release layers are removed before the second pressing operation.

As can be seen from the above brief description of the invention a very important aspect is the provision of a very smooth flat surface to the transition between the rigid-fiberglass and the flexible polyimide by creating the bond between the polyimide and the fiberglass under conditions where that surface to be mounted to the copper is held in contact with a smooth rigid plate and the other, back surface, is supported by a flowable curable member which compensates for the difference in thickness between the fiberglass and the polyimide sheet. In one typical example the fiberglass sheet at the beginning of the pressing operation is 0.003-0.005 inch thick while the polyimide is only 0.001-0.003 inch thick.

DETAILED DESCRIPTION OF THE INVENTION

Reference should be had now to the following drawings taken in connection with the accompanying specification as described one preferred embodiment of the invention.

FIG. 1 is FIG. 5 of my prior U.S. Pat. No. 4,800,461.

Referring to FIG. 1, the same numbers are used as in my earlier U.S. Pat. No. 4,800,461.

Figure 1:
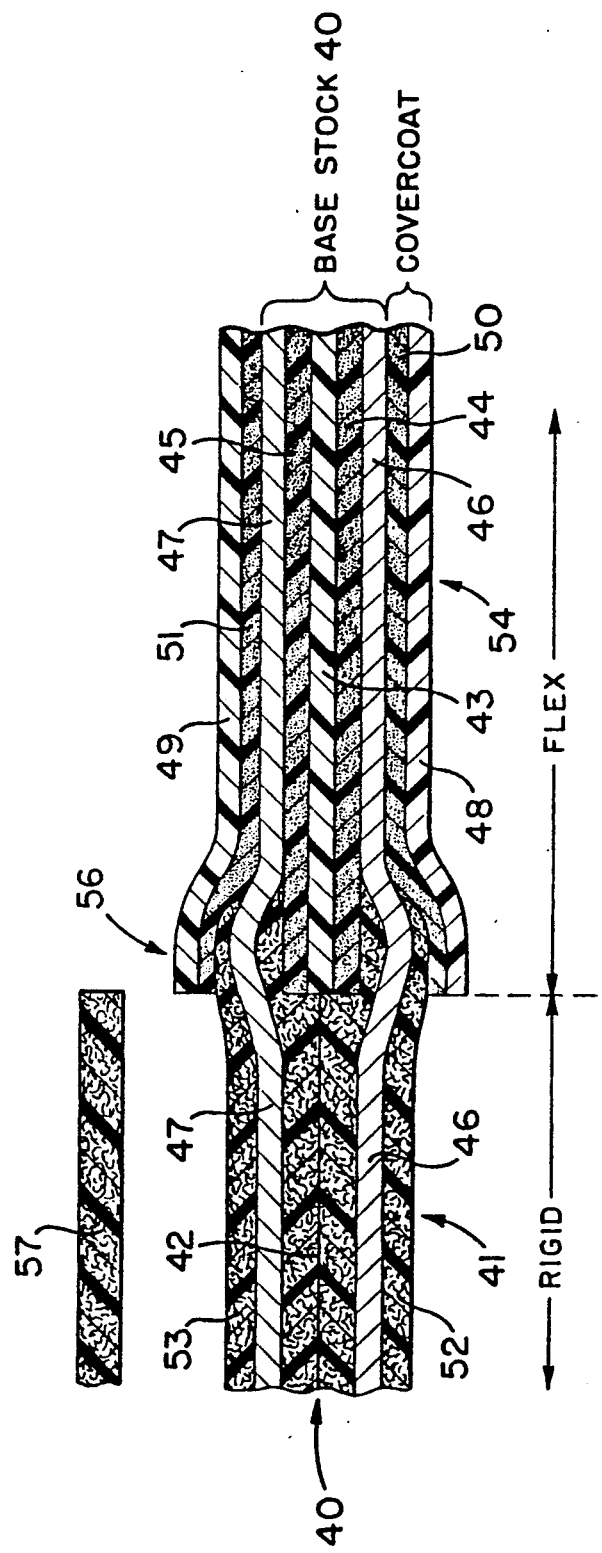

In this product of FIG. 1 the rigid section comprises portion 41 having fiberglass epoxy layers 53, 42, 52 and 57 and copper layers 46 and 47. The flexible portion comprises polyimide layers 49, 47, 43, and 48 and acrylic layers 51, 50, 45 and 44. This present invention is particularly directed to the production of a flat smooth transition between the rigid and the flexible portions of the circuit.

Figure 2:
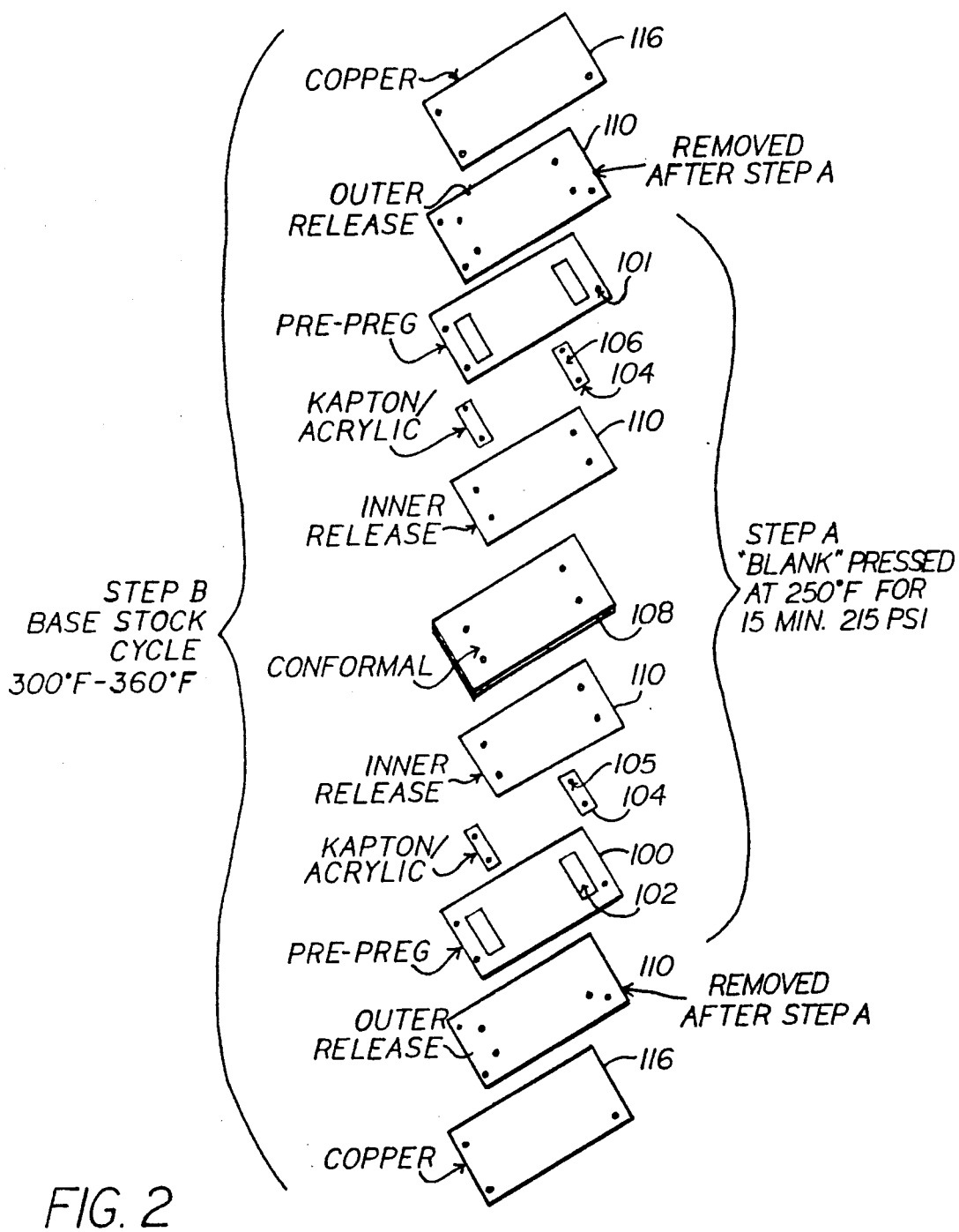
FIG. 2 is as an expanded process diagram showing the arrangement of the various layers in the two pressing steps. Step A creates the smooth outer surface of the sandwich and Step B is the second processing step wherein the copper sheets are bonded to the smooth outer surfaces of the sandwich.

Referring now to FIG. 2, there is shown an exploded view of the various layers to be assembled in the two pressing operations. In the first pressing operation, the layer 100 is the bottom prepreg. On top of this a polyimide layer 104 which overlies the cutout portion 102 of the prepreg 100. Locating holes 101 are provided for precisely aligning all of the various layers. Similar locating holes 105 are provided in polyimide sheets 104, the holes being positioned where they will not interfere with the printed circuit design. That surface of the polyimide 104 to be placed adjacent the prepreg 100 is shown as containing a layer of acrylic adhesive 106. On top of the first prepreg polyimide layer is provided a sheet 110 of release material such as teflon, which is sufficiently smaller than the prepreg layer 100 so that there is a space about one inch in width exists around the whole edge of the release layer 110. Next is provided the conformal layer 108 which has the same approximate dimension as the prepreg layer 100, thus edge portions of the prepreg layer 100 and the conformal layer 108 abut each other without any intervening release layer. Next is the release layer 110, another polyimide layer 104 and a second prepreg layer 100. On the outsides of the two prepreg layers 100 are provided additional release layers 110 which prevent adhesion of the prepreg layers 100 to the pressing plates.

The polyimide layer can be temporarily bonded to the release layer by localized application of heat and pressure around the holes 105 to prevent lateral slippage of the polyimide with respect to the semi-rigid epoxy fiberglass layer 100 when assembling the sandwich for the first pressing operation.

The first pressing operation partially cures the prepregs and the conformals, and bonds all the curable layers together at their edges to form a relatively rigid sandwich. The press is opened, the outer release sheets 110 are removed and the copper sheets 116 are positioned in the press by use of locating holes 117 and the pressing operation is continued at a higher temperature to firmly bond the two copper layers to the outer surfaces of the sandwich. Thereafter the two steel sheets are separated. The product can then be coated with a photo-resist and exposed to the necessary circuit diagram, the smooth copper surface lying in a single plane for accurate photo exposure. This exposure is preferably accomplished before disassembling the sandwich. The copper will have a smooth surface, since it was bonded in a ripple-free fashion, and can be held in a flat focal/plane.

Figure 3:
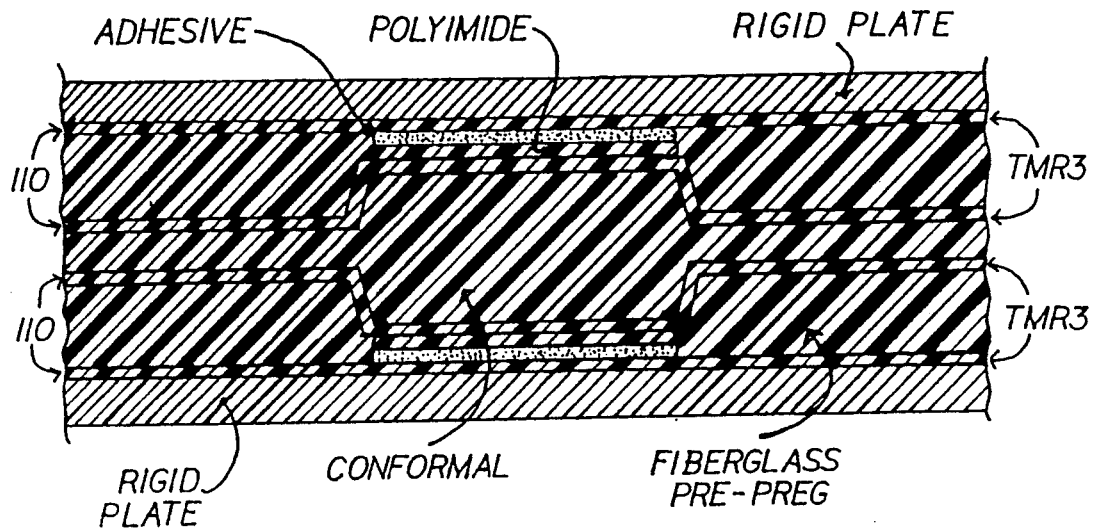
FIG. 3 is a diagramatic schematic drawing showing the sandwich of the two fiberglass-polyimide layers with a filling of conformal situated between two flat rigid pressing plates.
Figure 4:
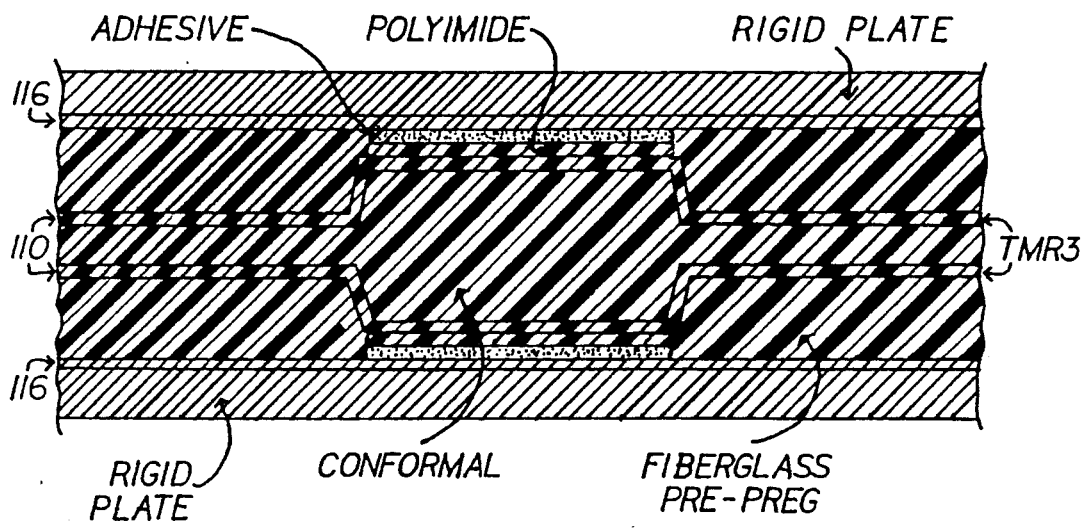
FIG. 4 is a view similar to FIG. 3 showing the final product with the copper layer 116 being bonded to the product of the first pressing operation.

Referring now to FIG. 3 and 4, there is shown the sandwich assembly comprising the preferred form of invention. There is first provided a sheet of fiberglass-epoxy prepreg 100 which is provided with an opening 102. Spanning the opening is a layer of polyimide 104 which overlaps the opening by approximately 0.050 inches. The upper surface as seen in FIG. 4 of the polyimide is provided with a layer of acrylic adhesive 106. Behind the composite polyimide fiberglass layers is a "conformal" layer which preferably is a flowable, curable fiberglass epoxy prepreg. The purpose of the "conformal" is to fill in the space behind the polyimide film so as to compensate for the thinner polyimide sheet to force the upper surface of the polyimide sheet into conformance with a smooth surface 112. During the first pressing operation both the fiberglass prepreg and the "conformal" prepreg are partially cured so that they retain the shape obtained in the first pressing. After the first pressing step the outer two release coats are removed and replaced by two layers of copper 116 (see FIG. 4) since the sandwich edges are sealed together, the various layer of the sandwich, comprising fiberglass-polyimide-"conformal", remain as a relatively stiff unit. Pressing is then continued to bond the copper layers 116 to the outer surfaces of the sandwich. As mentioned, two slightly smaller layers 110 of Teflon are provided, one on each side of the conformal, to prevent adhesion of the major portions of "conformal" to the outer layers of the sandwich so that eventually the conformal can be removed from the sandwich.

As mentioned, it is also preferred that adhesion between the rigid plates 112 and the fiberglass-polyimide acrylic system be prevented by use of release sheet 110 in the first pressing Step A.

In the preferred embodiment of the invention the following materials are combined under the detailed specified conditions.

EXAMPLE I

Fiberglass epoxy "No Flow" layers 100 are system "1080", in accordance with MIL-P-13949, and are initially on the order of 0.003–0.005 inches thick.

Polyimide layers 104 are preferably 0.001–0.003 inch thick DuPont Kapton.

Acrylic adhesive 106 is on the order of 0.001–0.003 inch thick and is designated JW 712.

Teflon release sheets 110 are preferably DuPont "superclean" grade TMR3, 0.001 inch thick.

"Conformal" prepreg 108 is preferably formed of two layers of fiberglass epoxy 1080 in accordance with the same specs as the fiberglass prepreg except that it is designated "High Flow" rather than "No Flow". This permits the product of layer 108 to flow into the space adjacent the back of the polyimide sheet to permit creation of a smooth front surface.

Copper sheets 116 are preferably IPC-CF-150 Type WRA. They are 0.0042 inch–0.00075 inch, that is 3 ounce to ½ ounce, depending on the circuit requirements.

First pressing operation is conducted at 216 psi, and 250 degrees F. for 30 minutes.

Second pressing operation is carried out at 300–360 degrees F. at 216 psi for 60 minutes. After the resulting sandwich, with the copper on the outside, is removed from the press it is then treated in accordance with normal printed circuit technology. For example, it can be pumice cleaned, photo-resist is then applied, the resist is exposed on both sides, the pattern is developed, the product is etched and optionally the copper is provided with a black oxide. Thereafter, the sealed "picture frame" edges are then cut and discarded to permit separation of the inner layers to remove the conformal layer and to provide a pair of rigid-flex printed circuits.

The product resulting from development of a photoresist—etch circuit on the copper surface can be combined with other circuit elements as described in more detail in my prior U.S. Pat. No. 4,800,461, the disclosure of which is incorporated herein in its entirety.

While a preferred form of the invention has been described above, numerous other curable and flexible insulating layers may be employed.

We claim:

1. In an improved process for manufacturing a rigid-flex printed circuit wherein a rigid insulating layer supports one portion of the printed circuit and a flexible insulator supports another portion thereof to furnish flexible leads for connection of the printed circuit to an operative device, the improvement wherein a first assembly is provided comprising a curable prepreg insulator layer having an opening for the flexible leads, and a flexible sheet spanning the opening, pressing the assembly with one surface in contact with one smooth hard surface while the other surface is supported by a flowable curable prepreg layer, and separated there from by a release layer which prevents bonding between said prepreg layers throughout most of the areas while permitting bonding along the edges, holding the assembly under heat and pressure to partially cure both prepreg layers and bond the flexible sheet to the edges of the opening and bond the edges of said prepregs together to form a flat rigid sandwich, thereafter bonding a sheet of copper to that surface previously in contact with the hard surface, in a second pressing operation under conditions to bond the copper to both the partially cured prepreg layer and the flexible sheet, and thereafter severing the bonded edges of said cured prepreg layers to permit separation thereof to provide a printed circuit board having rigid and flexible portions.

2. The process of claim 1 wherein the curable prepreg insulator layer has been partially cured to a simirigid state prior to the first press step.

3. The process of claim 2 wherein a sandwich is made of two prepreg layers and two flexible sheets on opposite sides of said flowable prepreg layer.

4. The process of claim 3 wherein release sheets are provided on both sides of said flowable prepreg layer.

5. The process of claim 4 including the additional steps of creating and exposing a photo resist on the outer surfaces of the sealed sandwich before separating the layers.

* * * * *